US009522599B2

(12) United States Patent
Gibbs

(10) Patent No.: US 9,522,599 B2
(45) Date of Patent: Dec. 20, 2016

(54) METHOD FOR ESTIMATING PARAMETERS FOR A VEHICLE BATTERY

(75) Inventor: James C. Gibbs, Brighton, MI (US)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 695 days.

(21) Appl. No.: 13/423,810

(22) Filed: Mar. 19, 2012

(65) Prior Publication Data

US 2013/0241565 A1  Sep. 19, 2013

(51) Int. Cl.
| | | |
|---|---|---|
| *G01R 31/36* | (2006.01) | |
| *B60L 7/18* | (2006.01) | |
| *B60L 11/14* | (2006.01) | |
| *B60L 11/18* | (2006.01) | |

(52) U.S. Cl.
CPC ............... *B60L 7/18* (2013.01); *B60L 11/14* (2013.01); *B60L 11/1857* (2013.01); *B60L 11/1861* (2013.01); *B60L 11/1868* (2013.01); *B60L 2240/545* (2013.01); *B60L 2240/547* (2013.01); *B60L 2240/549* (2013.01); *B60L 2260/44* (2013.01); *G01R 31/3606* (2013.01); *Y02T 10/70* (2013.01); *Y02T 10/7005* (2013.01); *Y02T 10/7044* (2013.01); *Y02T 10/7066* (2013.01); *Y02T 10/7077* (2013.01)

(58) Field of Classification Search
CPC . G01R 31/36; G01R 31/3606; G01R 31/3627; G01R 31/3644; G01R 31/3648
USPC .................................................. 324/428, 433
See application file for complete search history.

(56) References Cited

U.S. PATENT DOCUMENTS

| 8,108,160 | B2* | 1/2012 | Liu et al. ......................... 702/63 |
|---|---|---|---|
| 2003/0184307 | A1* | 10/2003 | Kozlowski et al. .......... 324/427 |
| 2006/0015231 | A1* | 1/2006 | Yoshimura et al. ............ 701/48 |
| 2006/0064223 | A1* | 3/2006 | Voss ............................... 701/52 |
| 2007/0029121 | A1* | 2/2007 | Saitou et al. ................ 180/65.2 |
| 2007/0187161 | A1* | 8/2007 | Kiuchi ......................... 180/65.2 |
| 2009/0043441 | A1* | 2/2009 | Breed ............................ 701/29 |
| 2009/0091299 | A1* | 4/2009 | Lin et al. ..................... 320/137 |
| 2009/0312889 | A1* | 12/2009 | Krupadanam et al. .......... 701/1 |
| 2010/0023285 | A1* | 1/2010 | Nakanishi ..................... 702/63 |

OTHER PUBLICATIONS

Chinese Office Action dated Dec. 18, 2014, 10 pages.

* cited by examiner

*Primary Examiner* — Edward Tso
*Assistant Examiner* — Jerry D Robbins
(74) *Attorney, Agent, or Firm* — Reising Ethington, P.C.; Lionel D. Anderson

(57) ABSTRACT

A method and system for accurately estimating one or more vehicle battery parameters, such as state-of-charge (SOC). In an exemplary embodiment, a battery control module gathers standard battery readings for estimating SOC at a relatively slow sampling rate. The battery control module receives adjustment data from one or more control modules located around the vehicle, where the control modules gather readings at faster sampling rates and then provide the information to the slower battery control module. The adjustment data from the faster control modules is representative of energy consumption and/or generation events that occur in between the readings taken by the battery control module at the slower sampling rate, and enable the method to make a more accurate and complete estimate of SOC.

20 Claims, 3 Drawing Sheets

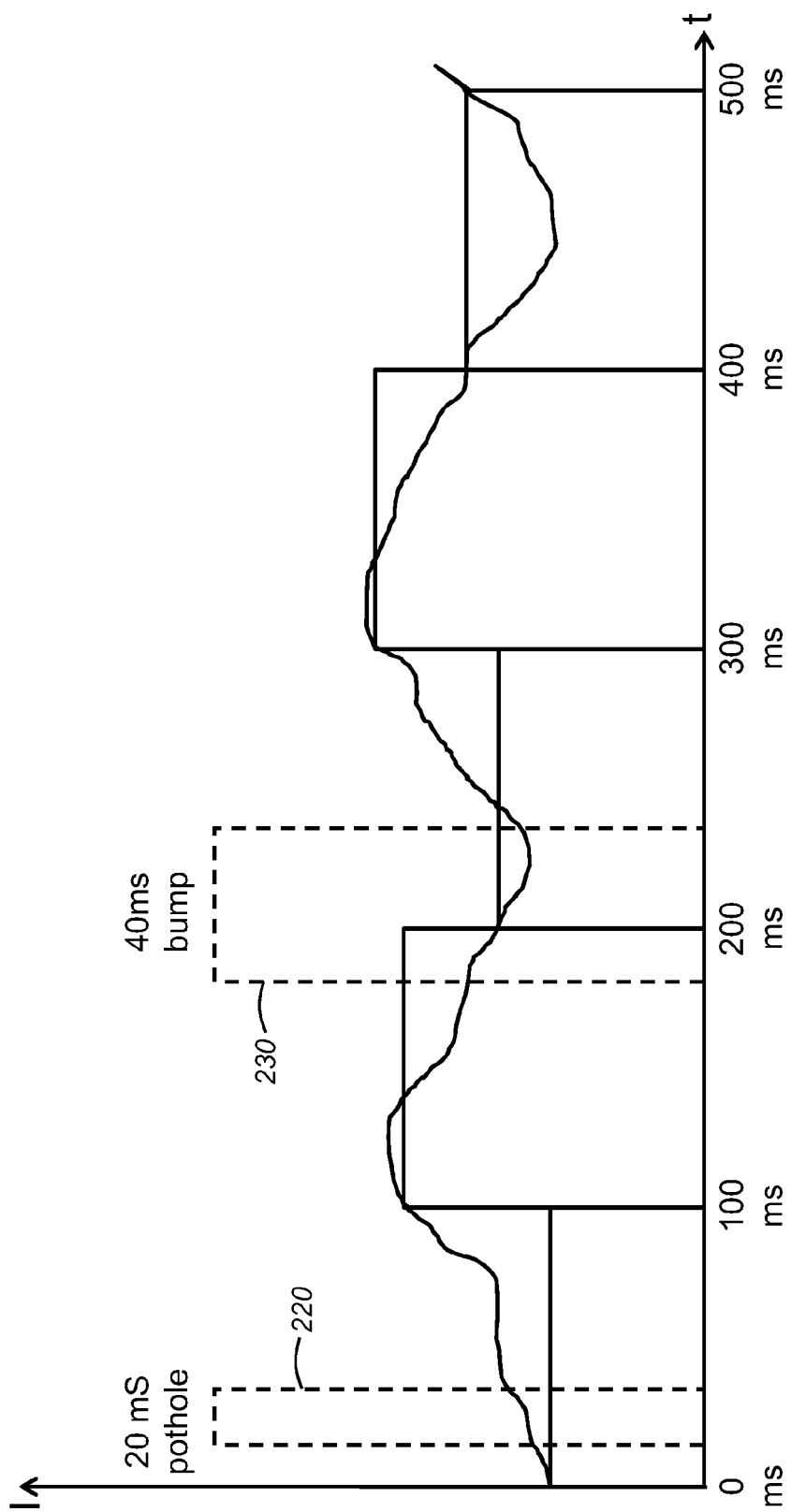

METHOD FOR ESTIMATING PARAMETERS FOR A VEHICLE BATTERY

FIELD

The present invention generally relates to a vehicle battery and, more particularly, to a method for accurately estimating one or more vehicle battery parameters, such as a state-of-charge (SOC).

BACKGROUND

The state-of-charge (SOC) of a high-voltage battery, such as the type commonly used for vehicle propulsion in hybrid electric vehicles (HEVs), generally refers to the amount of charge or energy that remains in the battery and is usually expressed in terms of a percentage. Those skilled in the art will appreciate that it may be desirable to maintain certain types of batteries, like those based on lithium-ion chemistries, within a predetermined SOC range. Overcharging and/or undercharging the battery so that its SOC goes beyond the boundaries or limits of the predetermined SOC range may result in diminished battery life, battery performance, vehicle fuel economy and/or other undesirable consequences.

Accordingly, it is desirable to have an accurate state-of-charge (SOC) estimate for the battery, as it can be difficult to properly maintain the battery within the predetermined SOC range if the present SOC value is not accurately known. One factor that can potentially impact the accuracy of the SOC estimate is processor speed; that is, the speed of the control module processors that govern the devices that are consuming energy and that are performing the SOC calculations. For example, if a suspension control module operates at a faster processor speed than that of a battery control module which performs the actual SOC calculations, then the battery control module may not account for all of the energy that is being consumed by the suspension devices under the governance of the suspension control module. This could lead to an inaccurately low SOC estimate, which in turn makes maintaining the battery within the predetermined SOC range more difficult.

SUMMARY

According to one embodiment, there is provided a method for estimating a vehicle battery parameter. The method may comprise the steps of: (a) determining an initial value for the vehicle battery parameter being estimated, where the initial value is based on data gathered at a first sampling rate; (b) determining an adjustment factor for the vehicle battery parameter being estimated, where the adjustment factor is based on data gathered at a second sampling rate that is faster than the first sampling rate; and (c) modifying the initial value with the adjustment factor to determine an overall value for the vehicle battery parameter being estimated. The overall value may take into account changes to the vehicle battery parameter that are represented in the data gathered at the second sampling rate but are not represented in the data gathered at the first sampling rate.

According to another embodiment, there is provided a method for estimating a state-of-charge (SOC) for a vehicle battery. The method may comprise the steps of: (a) determining an initial value for the SOC, where the initial value is based on data gathered by a first device; (b) determining an adjustment factor for the SOC, where the adjustment factor is based on data gathered by a second device that gathers data faster than the first device; and (c) modifying the initial value with the adjustment factor to determine an overall value for the SOC. The overall value may take into account changes to the SOC that are represented in the data gathered by the second device but are not represented in the data gathered by the first device.

DRAWINGS

Preferred exemplary embodiments will hereinafter be described in conjunction with the appended drawings, wherein like designations denote like elements, and wherein:

FIG. 3 is a graph that plots energy consumption versus time for an exemplary device or actuator and helps illustrate one or more of the steps shown in FIG. 2.

DESCRIPTION

The method and system described below may be used to accurately estimate one or more vehicle battery parameters, such as state-of-charge (SOC). In an exemplary embodiment, a battery control module gathers standard battery readings for estimating SOC at a relatively slow sampling rate. The battery control module receives adjustment data from one or more control modules located around the vehicle, where the control modules gather readings at faster sampling rates and then provide the information to the slower battery control module. The adjustment data from the faster control modules is representative of energy consumption and/or generation events that occur in between the readings taken by the battery control module at the slower sampling rate, and enable the method to make a more accurate and complete estimate of SOC. Although the following description is provided in the context of state-of-charge (SOC) and involves exemplary suspension and brake control systems, it should be appreciated that the present system and method may be used to estimate other battery parameters (other than SOC) and may be used with other modules, devices, systems, etc. around the vehicle (other than suspension and brake control systems). For instance, the present system and method may be used with vehicle safety systems, stability systems and anti-lock braking systems (ABS), to cite a few possibilities.

Figure 1:
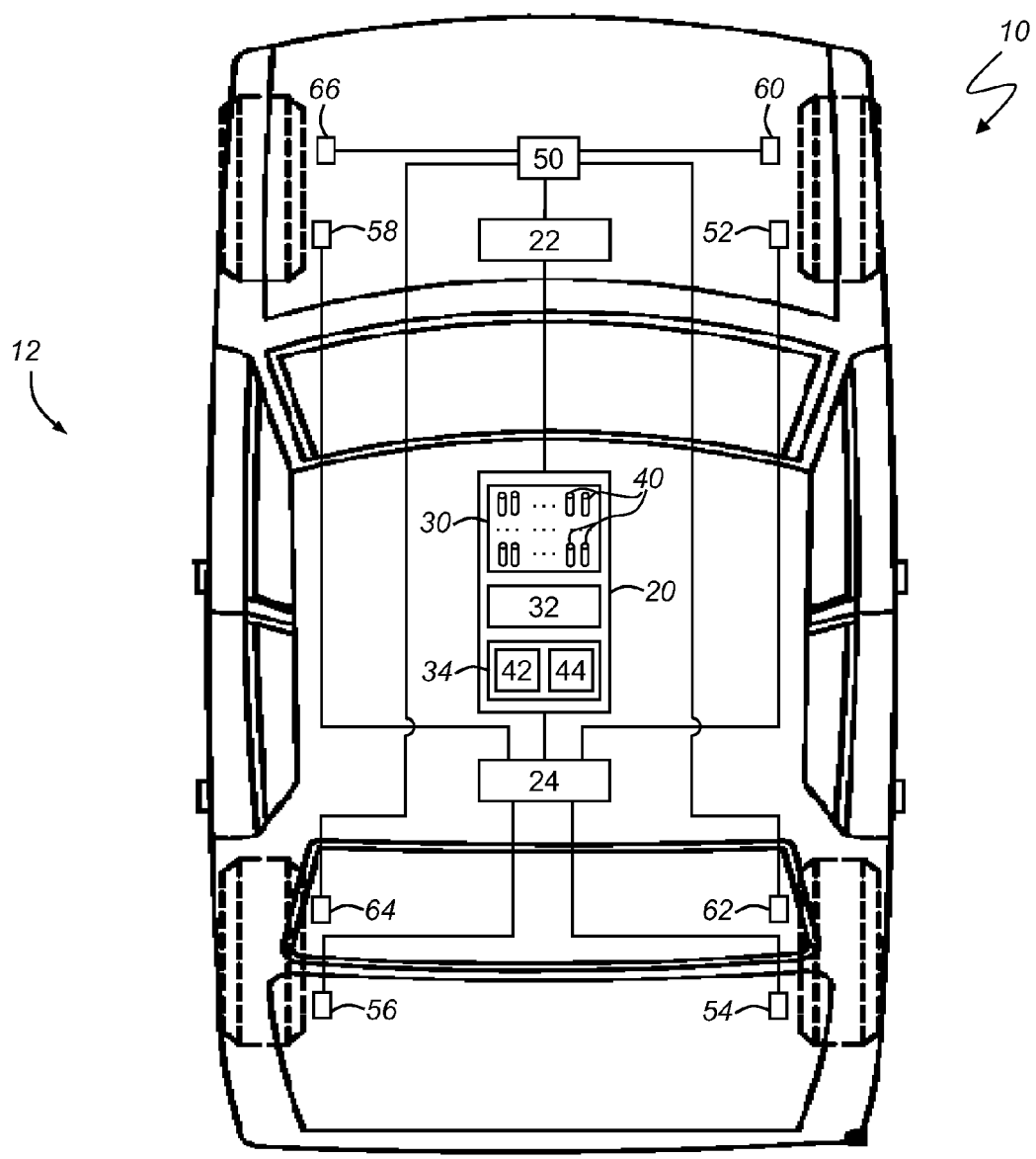
FIG. 1 is a schematic view of a vehicle having an exemplary battery control system.

With reference to FIG. 1, there is shown a general and schematic view of an exemplary vehicle 10 having a battery control system 12. It should be appreciated that the present system and method may be used with any number of different types of vehicles, including hybrid electric vehicles (HEVs), plug-in hybrid electric vehicles (PHEVs), extended-range electric vehicles (EREVs), and battery electrical vehicles (BEVs), to name but a few. These are merely some of the possible applications, as the system and method described herein are not limited to the exemplary embodiment shown in FIG. 1 and could be used in any number of different vehicles. According to one embodiment, battery control system 12 includes a vehicle battery 20 and communicates with a brake control module 22 and a suspension control module 24, as well as other control modules and systems around the vehicle.

Battery 20 provides the vehicle with electrical power for vehicle propulsion and, depending on the particular embodiment, may be the primary electrical power source for the vehicle or may be used in conjunction with another power source for power supplementation purposes, to cite two examples. Many different battery types and arrangements may be used, including the exemplary one schematically shown here which includes a battery pack 30, one or more battery sensors 32, and a battery control module 34. Battery pack 30 is a high-voltage battery pack and may include a collection of identical or individual battery cells 40 connected in series, parallel, or a combination of both in order to deliver a desired voltage, amperage, capacity, power density and/or other performance characteristics. Generally, it is desirable to provide high power and energy densities, which has led to the development and use of many types of batteries including chemical, non-chemical, and others. Some examples of suitable battery types include those that are based on the following technologies: lithium ion, nickel metal hydride (NiMH), nickel cadmium (NiCd), sodium nickel chloride (NaNiCl), or some other battery technology. According to an exemplary embodiment, battery pack 30 is based on lithium-ion technology and provides approximately 40V-600V, depending on its particular design and application. For example, a heavy truck using a two-mode hybrid system may require a battery pack capable of providing high voltage levels, where a lighter vehicle may need lower voltage levels. In another embodiment, battery 20 is part of a belt-alternator-starter (BAS) or BAS-plus type system and thus only requires a battery pack providing lower voltage levels. Skilled artisans will appreciate that the system and method described herein are not limited to any one particular type of battery, chemistry and/or arrangement, as a number of different battery types could be employed.

Battery sensors 32 may include any combination of hardware and/or software components capable of monitoring battery parameters such as battery temperature, battery voltage, battery current, battery state-of-charge (SOC), battery state-of-health (SOH), C-rate, etc. These sensors may be integrated within battery pack 30 (e.g., an intelligent or smart battery), they may be external sensors located outside of the battery pack, or they may be provided according to some other known arrangement. Battery sensors 32 may monitor and determine battery conditions on a cell-by-cell basis, on an average or collective basis across a block or region of cells, on an entire battery pack basis, on a representative basis where certain cells are selected to represent the entire battery pack, or according to some other basis or technique known in the art. In one example, battery sensors 32 gather battery voltage, current and/or temperature readings on a periodic basis and provide them to battery control module 34, or some other appropriate device.

Battery control module 34 may include any variety of electronic processing devices, memory devices, input/output (I/O) devices, and/or other known components, and may perform various control and/or communication related functions. In an exemplary embodiment, battery control module 34 includes an electronic memory device 42 that stores various sensor readings (e.g., voltage and current readings from sensors 32, etc.), look up tables or other data structures, algorithms, etc. Memory device 42 may also store pertinent battery characteristics and background information pertaining to the battery's cell chemistry, cell capacity, upper and lower battery state-of-charge (SOC) limits, battery voltage limits, battery current limits, battery temperature limits, temperature profiles, battery impedance, number or history of charge/discharge cycles, etc. In the exemplary embodiment shown in FIG. 1, battery control module 34 also includes a processor device 44 (e.g., a microprocessor, a microcontroller, an application specific integrated circuit (ASIC), etc.) that executes instructions for software, firmware, programs, algorithms, scripts, etc. and may govern the processes and methods described herein. Battery control module 34 may be electronically connected to other vehicle devices and modules via a suitable vehicle communications connection and can interact with them when required. These are, of course, only some of the possible arrangements, functions and capabilities of battery control module 34, as other embodiments could also be used.

As mentioned above, the processor in battery control module 34 may not be as fast as the processors in other control modules, such as brake and suspension control modules 22, 24. One potential reason for this is that battery control module 34 is typically not required to monitor fast transient events—like those monitored and addressed by brake and suspension control modules 22, 24—and thus there is not a compelling need for faster and more expensive hardware. For instance, an exemplary battery control module may run a state-of-charge (SOC) estimate on a 100 ms loop, while an exemplary suspension control module may run active suspension control according to a 0.25 ms loop; in this example the suspension control module is operating 400 times faster than the battery control module and is controlling actuators or other devices that can use significant amounts of power (e.g., 20-30 kW of potential draw). Accurate SOC estimates can be further complicated because of synchronization issues between battery voltage and current readings, as well as aliasing issues that are appreciated by those skilled in the art.

Depending on the particular embodiment, battery control module 34 may be a stand-alone vehicle electronic module (e.g., a vehicle control integrated module (VCIM), a traction power inverter module (TPIM), a battery power inverter module (BPIM), etc.), it may be incorporated or included within another vehicle electronic module (e.g., a power train control module or a hybrid control module), or it may be part of a larger network or system (e.g., a battery management system (BMS), a vehicle energy management system, etc.), to name a few possibilities. Battery control module 34 may also be part of or interact with a system that determines a desired hybrid operating mode (e.g., accelerating, braking, idling, stopping, etc.) and may implement electrical power management actions accordingly. Many different architectures and arrangements may be used with the method described below; for instance, the vehicle battery pack 30, sensors 32, and control module 34 may all be integrated and included within one package or they could be separate. The present method is not limited to the exemplary battery control system shown in FIG. 1, as that system is simply provided for purposes of illustrating one potential application.

Brake control module 22 and suspension control module 24 are two examples of control modules that can operate at a faster speed than battery control module 34 and that manage devices that can draw significant power. The brake and suspension control modules described herein are simply meant to illustrate two such control modules, as other control modules that meet these criteria exist in the vehicle and may be involved with the present method as well. In view of the fact that brake and suspension control modules are well known in the art and because any number of different control module embodiments and arrangements may be used, control modules 22, 24 are not described here in great detail.

Brake control module 22 controls certain aspects of vehicle braking and may periodically provide energy adjustment data so that an accurate accounting can be made of the energy that is consumed and/or generated by the vehicle brake system. Brake control module 22 may receive data from a number of different sources like a brake pedal sensor, an anti-lock braking system (ABS), a hybrid control module, etc. and use this data to formulate brake command signals that it then sends out to one or more actuators 50 that control braking devices 60-66 located at the four corners of the vehicle. Some examples of a suitable actuator 50 include a solenoid, valve, pump, etc., and examples of suitable braking devices 60-66 include disk-, drum- or regenerative-brake components, e-calipers, etc. The brake command signals can dictate the brake torque exerted by braking devices 60-66, and can also affect the amount of electrical energy that is consumed and/or generated by the vehicle brake system. Skilled artisans will appreciate that during non-regenerative braking events the vehicle brake system typically consumes energy, while in regenerative braking events the vehicle brake system generates energy. Brake control module 22 can be used in conjunction with a regenerative braking system, non-regenerative braking system, electro-hydraulic braking system, electro-mechanical braking system, brake-by-wire system, or any other suitable braking system known in the art.

Suspension control module 24 controls certain aspects of vehicle suspension and handling, and it may periodically provide energy adjustment data so that the energy that is consumed by the vehicle suspension system can be better accounted for. In one example, suspension control module 24 receives input and data from various sources around the vehicle and uses this information to develop suspension command signals that it provides to devices like actuators 52-58, which then make adjustments to the vehicle suspension system based on the command signals. Some examples of suitable actuators 52-58 include dampers, shock-absorbers, electro-magnetic components, magneto-rheological components and/or other devices in an active or semi-active vehicle suspension system. For example, control module 24 can adjust the damping at a particular wheel by altering the amount of current and/or voltage that is provided to an electro-magnet in actuators 52-58; increasing the current usually raises the compression/rebound rates of the damper, while decreasing the current softens the effect of the damper.

Again, the preceding descriptions and the drawing in FIG. 1 are only intended to illustrate one potential embodiment and the following method is not confined to use with only that embodiment. Any number of other system arrangements, combinations and architectures, including those that differ significantly from the one shown in FIG. 1, may be used instead.

Figure 2:
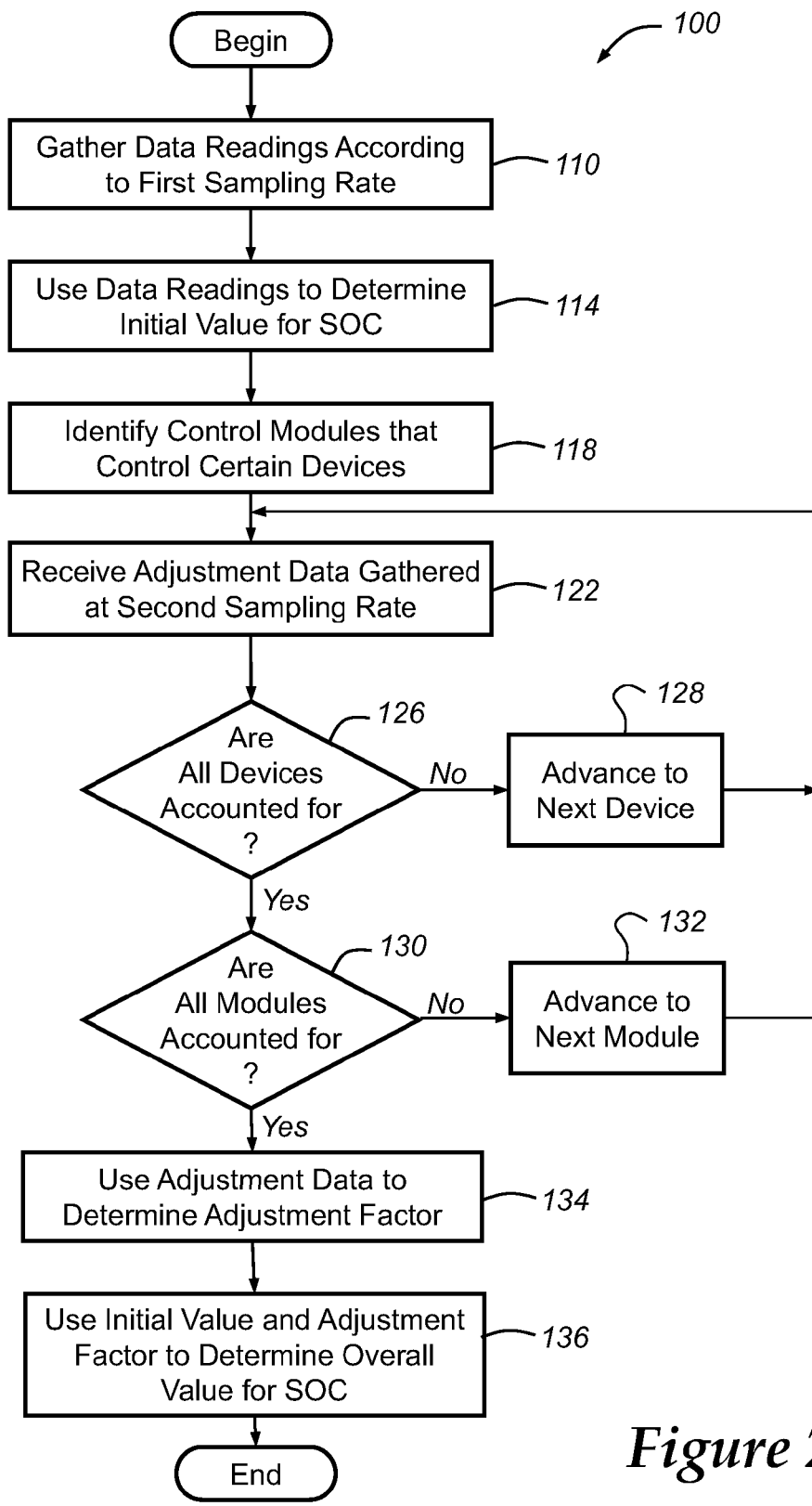
FIG. 2 is a flowchart of an exemplary method that may be used with a battery control system, such as the one shown in FIG. 1, to estimate a vehicle battery parameter.

Turning now to FIG. 2, there is shown an exemplary method 100 that may be used with battery control system 12 in order to estimate a vehicle battery parameter, such as state-of-charge (SOC). As previously explained, some devices like battery control module 34 may operate at a relatively slow speed and therefore be unable to detect all of the energy consumption and/or generation that occurs with devices that are operating at faster speeds. This is particularly true if there is a quick, momentary surge in energy consumption and/or generation that occurs in between the slower data readings taken by battery control module 34; changes in the SOC that are due to the momentary surge may not be fully appreciated or taken into account if only the slower battery control module is used to take data readings. Although the following description is in the context of state-of-charge (SOC), it should be appreciated that method 100 may be used to estimate other vehicle battery parameters as well.

Beginning with step 110, the method gathers data readings according to a first sampling rate. The data readings may include different types of information and may be acquired in a variety of ways, so long as they can be used to determine an initial value for the vehicle battery parameter being estimated. For instance, if the method is attempting to estimate state-of-charge (SOC), then battery control module 34 may gather battery voltage and current readings from battery sensors 32 (skilled artisans appreciate that SOC can be estimated from voltage and current readings). In this example, the voltage and current readings are gathered at a first sampling rate (e.g., every 100 ms), where the first sampling rate is generally dictated by the speed of battery control module 34. The data readings can be gathered on a cell-by-cell basis, on a cell group-by-cell group basis, on a representative cell basis, on an overall pack basis, or according to some other suitable basis, as described above. It is also possible for step 110 to indirectly gather the data readings from some other device, module or system in the vehicle, as opposed to directly gathering them from the battery sensors.

Step 114 then uses the data readings from the preceding step to determine an initial value for state-of-charge (SOC). There are various ways for estimating SOC, including ones that utilize look-up tables, computational methods, modeling and/or other known techniques. The SOC calculations in this step may be performed on a periodic basis so that an SOC estimate is continuously being updated. In one embodiment, step 114 uses the battery voltage and current readings from the previous step, as well as the accumulated amp-hours, to calculate a change in SOC since the vehicle was last turned. This change in SOC is then subtracted from or added to the last known SOC estimate (e.g., an estimate saved in memory before the vehicle was turned off) to arrive at an initial value for SOC. Other techniques may certainly be used to determine an SOC initial value, as this step is not limited to any particular one. Step 114 may determine an initial value for SOC each time step 110 provides data readings; that is, steps 110 and 114 may be synchronized and operate at the same first sampling rate. Or, in a different example, steps 110 and 114 operate according to different sampling rates. In either case, the initial value for SOC that is generated in step 114 does not generally take into account changes that occur in between the slower data readings of the first sampling rate, as explained below.

FIG. 3 is a plot showing energy consumption by an exemplary vehicle suspension system (expressed as current (I) versus time (t)), where battery control module 34 takes data readings according to a first sampling rate of 100 ms, but suspension control module 24 controls actuators 52-58 on a much faster basis. Consider energy consumption event 220 (shown in broken lines) which is representative of the vehicle momentarily encountering a pothole in the road. In response, suspension control module 24 very quickly drives actuators 52-58 such that there is a temporary spike in their energy use or consumption. Since battery control module 34 takes data readings at time 0 ms and time 100 ms, it is unaware that energy consumption event 220 has occurred for approximately 20 ms in between readings. If the method were to take a data reading at the beginning of the cycle (0 ms) or the end of the cycle (100 ms) and assume that the energy consumption in the interim is the same as at one of these two points, then it would fail to account for the surge in energy that occurs due to energy consumption event 220. Now consider the example where the vehicle engages a large bump in the road that causes vehicle suspension control module 24 to electrically drive actuators 52-58 over a longer more sustained period of about 40 ms; energy consumption event 230. This energy consumption event straddles or spans one of the data sampling points (200 ms). Thus, if the method were to gather data readings at this time, it would artificially believe that the energy consumption over the entire adjacent time period was higher than it actually was. In FIG. 3, energy consumption events 220 and 230 relate to energy that is consumed by suspension actuators or devices 52-58, however, other devices may consume energy or even produce energy (e.g., regenerative braking), as this chart is simply meant to illustrate some of the issues being addressed by the present method.

Next, the method determines an adjustment factor for the vehicle battery parameter being estimated, in this case state-of-charge (SOC). The adjustment factor is based on sensor readings that are provided by one or more control modules around the vehicle, such as brake control module 22 or suspension control module 24, where the control modules gather the sensor readings at sampling rates that are faster than the sampling rate used in step 110. For example, the SOC initial value that is determined in the preceding step estimates an initial value for SOC based on data readings taken every 100 ms, while the SOC adjustment factor that is determined in the following steps accounts for SOC changes that occur in between the 100 ms data readings. An exemplary way for the present method to determine an adjustment factor is for the method to identify one or more control modules that are in charge of certain devices that can affect or impact SOC (step 118), and then to receive adjustment data for all of the devices that are under the control of those control modules (steps 122-132). Once the adjustment data has been gathered and used to generate an adjustment factor, that factor may be added to or subtracted from the SOC initial value (depending if it represents energy consumed or generated) in order to arrive at a more accurate SOC overall value.

Beginning with step 118, the method identifies one or more control modules that control devices or actuators that affect state-of-charge (SOC). In one embodiment, step 118 identifies control modules that not only control devices or actuators that affect SOC, but also ones that operate at a faster speed than battery control module 34 and therefore may be unaccounted for. For instance, both the exemplary brake control module 22 and suspension control module 24 operate at faster or higher speeds than battery control module 34, and both of these control modules govern devices that can increase or decrease the SOC of the battery (actuators 50-58 consume energy and can thus reduce SOC, while braking devices 60-66 either consume or generate energy and can thereby reduce or increase SOC). If a particular control module is operating at the same speed or a slower speed than that of battery control module 34, then it may be presumed to already be taken into account by steps 110 and/or 114. In a non-limiting example, step 118 retrieves from memory device 42 a list of control modules and/or devices that are to be queried for adjustment data and the like. It is not necessary that the present method retrieve adjustment data from every control module and/or device in the vehicle that is capable of affecting battery SOC, as it may be preferable to only retrieve such data from those control modules that are expected to have the most significant impact on SOC. Skilled artisans should appreciate that other embodiments are also possible.

At step 122, the method receives adjustment data from one or more control modules. The particular content, form, source, destination, etc. of the adjustment data may vary, so long as it can be used to account for changes in the state-of-charge (SOC) that may have been missed in steps 110 and 114. In one example, step 122 receives adjustment data from brake control module 22, suspension control module 24 and/or some other device in the vehicle, where the adjustment data is based on data readings acquired at a faster sampling rate than that used by battery control module 34. The adjustment data may include energy consumption and/or generation values that are: for each device under the control of a particular control module, for all of the devices under the control of a particular control module, for devices under the control of multiple control modules, sent out periodically to battery control module 34, or sent out in response to a request from battery control module 34, to cite several possibilities. Generally speaking, the faster control modules (e.g., brake and suspension control modules 22, 24) can internally monitor energy consumption and/or generation by devices under their control and then report this information out to the slower control module (e.g. battery control module 34) that calculates SOC. The adjustment data received in this step may be used to generate an adjustment or compensation factor, or it may be extended to a distributed battery estimation system where all loads are calculated using energy used.

In an exemplary embodiment, step 122 may receive adjustment data for shorter energy consumption events (e.g., suspension events like reacting to a pothole that have durations that are less than the first sampling rate) and for longer energy consumption events (e.g., suspension events like ride leveling around a curve that have durations that are greater than the first sampling rate). The shorter energy consumption events can be assigned a statistically-based adjustment factor that is derived by using parameters such as the amount of energy and the duration of the energy consumption event, as well as the sampling rate of the suspension control module 24 (the second sampling rate) and/or the battery control module 34 (the first sampling rate). In some instances, the longer energy consumption events do not need to be adjusted in the same manner because they can be detected by battery control module 34 using the first sampling rate.

Steps 122, 126 and 128 ensure that all of the devices or actuators associated with a first control module have been accounted for. Take brake control module 22, for example, steps 122, 126 and 128 may continue to loop until data readings or other information from all of the braking devices 60-66 have been gathered. Once all of these devices have been properly accounted, the method proceeds to step 130 to determine if there are any other control modules that need to be accounted for. Continuing with the example from above, suspension control module 24 may then be queried so that any energy consumption by actuators 50-58 is taken into account. In this way, steps 122, 126, 128, 130 and 132 act as embedded loops that cycle through until all of the devices that are controlled by all of the control modules of interest have been addressed. These steps may repeat until all of the devices and/or control modules are accounted for and their corresponding energy consumptions are sent to battery control module 34 in the form of adjustment data. In doing so, information regarding energy consumption and/or generation by devices controlled by the control modules previously selected in step 118 is gathered at battery control module 34.

In one embodiment, one or more cumulative messages are sent according to the first sampling rate of the battery control module (e.g., 100 ms), where the cumulative message includes adjustment data spanning the entire first sampling period. In another embodiment, individual message are sent at the sampling rate of one or more of the control modules (e.g., 4 ms, 10 ms, etc.), where the individual messages only include data that pertains to a portion of the first sampling period. It is possible for the various control modules to simply provide the raw adjustment data to battery control module 34 so that the battery control module calculates the adjustment factor, or the control modules can calculate the adjustment factor themselves and send the resulting adjustment factor to the battery control module. The precise location where the adjustment factor is actually calculated is not critical, so long as step 134 uses the adjustment data to determine the adjustment factor.

Step 136 modifies the initial value with the adjustment factor to determine an overall value for the vehicle battery parameter being estimated, which in this case is state-of-charge (SOC). The overall value for SOC takes into account changes to SOC that are represented in the data gathered at the higher sampling rate but are not represented in the data gathered at the lower sampling rate, and thereby provides a more accurate SOC estimate. In one embodiment, battery control module 34 adds the SOC adjustment factor to the SOC initial value to arrive at an SOC overall value (the adjustment factor can be a positive or negative value depending on whether there were energy consumption events or energy generation events). If the devices or actuators primarily consume energy in between the slower sampling periods (energy consumption event), then the SOC overall value will be less than the SOC initial value. Conversely, if the devices primarily generate energy in between the slower sampling periods (energy generation event), as in the case of regenerative braking, then the SOC overall value will be greater than the SOC initial value. In a different embodiment, the initial value is multiplied by an adjustment factor in the form of a fraction, percentage and/or other value. Other mathematical techniques for modifying the initial value with the adjustment factor are possible and may be used here.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the specific combination and order of steps is just one possibility, as the present method may include a combination of steps that has fewer, greater or different steps than that shown here. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method for estimating a vehicle battery parameter, comprising the steps of:
   (a) determining an initial value for the vehicle battery parameter being estimated, the initial value is based on data gathered by a battery control module at a first sampling rate;
   (b) determining an adjustment factor for the vehicle battery parameter being estimated, the adjustment factor is based on data gathered from at least one other control module that controls devices that impact the vehicle battery parameter being estimated, and wherein the data from the at least one other control module is gathered at a second sampling rate that is faster than the first sampling rate;
   (c) modifying the initial value with the adjustment factor to determine an overall value for the vehicle battery parameter being estimated, wherein the overall value takes into account changes to the vehicle battery parameter that are represented in the data gathered at the second sampling rate but are not represented in the data gathered at the first sampling rate; and
   (d) using the battery control module and the overall value for the vehicle battery parameter to maintain a vehicle battery within a certain parameter range, wherein the battery control module includes an electronic memory device and a processor device and is connected to the at least one other control module.

2. The method of claim 1, wherein the vehicle battery parameter is a state-of-charge (SOC), and step (a) further comprises determining an initial value for the SOC, step (b) further comprises determining an adjustment factor for the SOC, and step (c) further comprises modifying the initial value with the adjustment factor to determine an overall value for the SOC.

3. The method of claim 2, wherein step (a) further comprises determining the initial value for the SOC by using battery voltage and battery current readings gathered at the first sampling rate.

4. The method of claim 2, wherein step (b) further comprises determining the adjustment factor for the SOC by using adjustment data gathered at the second sampling rate.

5. The method of claim 4, wherein step (b) further comprises using the battery control module to determine the adjustment factor for the SOC, the adjustment factor is determined by receiving the adjustment data from the at least one other control module at the battery control module and using the adjustment data to determine the adjustment factor.

6. The method of claim 5, wherein the at least one other control module is a suspension control module and the adjustment data represents energy that has been consumed by actuators under the control of the suspension control module.

7. The method of claim 5, wherein the at least one other control module is a brake control module and the adjustment data represents energy that has been consumed or generated by devices under the control of the brake control module.

8. The method of claim 4, wherein step (b) further comprises determining the adjustment factor for the SOC by using at least one of the following pieces of adjustment data: the amount of energy of an energy consumption event or the duration of an energy consumption event.

9. The method of claim 4, wherein step (b) further comprises determining the adjustment factor for the SOC by gathering adjustment data regarding energy consumption by a plurality of devices that are controlled by a single control module.

10. The method of claim 4, wherein step (b) further comprises determining the adjustment factor for the SOC by gathering adjustment data regarding energy consumption by a plurality of devices that are controlled by a plurality of control modules.

11. The method of claim 4, wherein step (b) further comprises determining the adjustment factor for the SOC by using adjustment data that is gathered at the second sampling rate and is provided in a cumulative message that is sent at the first sampling rate.

12. The method of claim 2, wherein step (c) further comprises adding the adjustment factor for the SOC to the initial value for the SOC to determine the overall value for the SOC, the overall value is less than the initial value during energy consumption events and the overall value is greater than the initial value during energy generation events.

13. A method for estimating a state-of-charge (SOC) for a vehicle battery, comprising the steps of:
  (a) determining an initial value for the SOC, the initial value is based on data gathered by a battery control module;
  (b) determining an adjustment factor for the SOC, the adjustment factor is based on data gathered by a second device that controls devices that impact the SOC, and wherein the second device gathers data faster than the battery control module;
  (c) modifying the initial value with the adjustment factor to determine an overall value for the SOC, wherein the overall value takes into account changes to the SOC that are represented in the data gathered by the second device but are not represented in the data gathered by the battery control module; and
  using the battery control module and the overall value for the SOC to maintain a vehicle battery within a certain SOC range, wherein the battery control module includes an electronic memory device and a processor device and is connected to the second device.

14. The method of claim 13, wherein step (a) further comprises determining the initial value for the SOC by using battery voltage and battery current readings gathered by the battery control module.

15. The method of claim 13, wherein step (b) further comprises determining the adjustment factor for the SOC by using adjustment data gathered by the second device.

16. The method of claim 13, wherein step (b) further comprises using the battery control module to determine the adjustment factor for the SOC, the adjustment factor is determined by receiving adjustment data from a separate control module at the battery control module and using the adjustment data from the separate control module to determine the adjustment factor.

17. The method of claim 16, wherein the separate control module is a suspension control module and the adjustment data represents energy that has been consumed by actuators under the control of the suspension control module.

18. The method of claim 16, wherein the separate control module is a brake control module and the adjustment data represents energy that has been consumed or generated by devices under the control of the brake control module.

19. The method of claim 16, wherein step (b) further comprises determining the adjustment factor for the SOC by using at least one of the following pieces of adjustment data: the amount of energy of an energy consumption event or the duration of an energy consumption event.

20. The method of claim 13, wherein step (c) further comprises adding the adjustment factor for the SOC to the initial value for the SOC to determine the overall value for the SOC, the overall value is less than the initial value during energy consumption events and the overall value is greater than the initial value during energy generation events.

* * * * *